United States Patent
Hasegawa

(10) Patent No.: US 8,514,581 B2
(45) Date of Patent: Aug. 20, 2013

(54) FLEXIBLE PRINTED WIRING BOARD AND ELECTRONIC APPARATUS HAVING FLEXIBLE PRINTED WIRING BOARD

(75) Inventor: Kenji Hasegawa, Hamura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 141 days.

(21) Appl. No.: 12/857,463

(22) Filed: Aug. 16, 2010

(65) Prior Publication Data

US 2011/0061928 A1    Mar. 17, 2011

(30) Foreign Application Priority Data

Sep. 11, 2009    (JP) .................................. 2009-210540

(51) Int. Cl.
*H05K 1/00*    (2006.01)
(52) U.S. Cl.
USPC ....... 361/749; 361/758; 361/679.58; 174/255
(58) Field of Classification Search
USPC .................................. 361/749, 758; 224/217
See application file for complete search history.

(56) References Cited

U.S. PATENT DOCUMENTS

| | | | | |
|---|---|---|---|---|
| 3,499,215 A | * | 3/1970 | Fetterolf et al. | 29/604 |
| 4,615,578 A | * | 10/1986 | Stadler et al. | 439/607.47 |
| 5,111,363 A | * | 5/1992 | Yagi et al. | 361/751 |
| 5,309,316 A | * | 5/1994 | Yagi et al. | 361/749 |
| 6,384,339 B1 | * | 5/2002 | Neuman | 174/254 |
| 6,900,393 B1 | * | 5/2005 | Cachina et al. | 174/260 |
| 2005/0207113 A1 | * | 9/2005 | Tanaka et al. | 361/687 |
| 2008/0146050 A1 | * | 6/2008 | Ju | 439/66 |
| 2009/0108471 A1 | | 4/2009 | Fujii | |
| 2009/0145632 A1 | | 6/2009 | Zhang | |
| 2010/0197368 A1 | * | 8/2010 | Kawate et al. | 455/575.1 |

FOREIGN PATENT DOCUMENTS

| | | |
|---|---|---|
| EP | 1941789 A1 | 7/2008 |
| JP | S61-161745 | 7/1986 |
| JP | H11-112125 | 4/1999 |
| JP | 2001-148554 | 5/2001 |
| JP | 2001-148554 A | 5/2001 |
| JP | 2003-124583 | 4/2003 |
| JP | 2003-124583 A | 4/2003 |
| JP | 2005-051177 | 2/2005 |
| JP | 2005-51177 A | 2/2005 |
| JP | 2007-194341 | 8/2007 |
| JP | 2007-194341 A | 8/2007 |

(Continued)

OTHER PUBLICATIONS

Notice of Reasons for Rejection mailed by the Japan Patent Office on May 24, 2011 in the corresponding Japanese patent app. No. 2009-210540 in 7 pages.

*Primary Examiner* — Tuan T Dinh
*Assistant Examiner* — Steven Sawyer
(74) *Attorney, Agent, or Firm* — Knobbe Martens Olson & Bear, LLP

(57) ABSTRACT

According to one embodiment, a flexible printed wiring board includes a component mounting portion to which a component is mounted and to which a reinforcing sheet is bonded. The component mounting portion includes an inner layer comprising a wiring pattern, and an outermost film layer disposed to cover the wiring pattern. The outermost film layer, to which the reinforcing sheet is bonded, is formed with a groove such that, when the reinforcing sheet is bonded, the groove extends in a region between the outermost film layer and the reinforcing sheet and communicates with an outside of the region.

5 Claims, 7 Drawing Sheets

(56) References Cited

FOREIGN PATENT DOCUMENTS

| | | |
|---|---|---|
| JP | 2007-234971 | 9/2007 |
| JP | 2007-335574 | 12/2007 |
| JP | 2007-335575 | 12/2007 |
| JP | 2009-513023 | 3/2009 |
| JP | 2009-111279 | 5/2009 |
| WO | WO 2007/048300 A1 | 5/2007 |

* cited by examiner

FLEXIBLE PRINTED WIRING BOARD AND ELECTRONIC APPARATUS HAVING FLEXIBLE PRINTED WIRING BOARD

CROSS-REFERENCE TO RELATED APPLICATIONS

This application claims priority from Japanese Patent Application No. 2009-210540 filed on Sep. 11, 2009, the entire content of which is incorporated herein by reference.

BACKGROUND

1. Field

One embodiment of the invention relates to a flexible printed wiring board and an electronic apparatus having the flexible printed wiring board.

2. Description of the Related Art

Flexible printed wiring boards are often used for connecting movable parts of peripheral devices of computers, such as hard disk drives (HDDs) and an optical disc drives (ODDs), owing to their high flexibility.

Flexible printed wiring boards are arranged in computer devices in a bent manner. Therefore, when there is a friction between portions of a flexible printed wiring board, particles may be scraped off from a film surface of the outermost layer of the flexible printed wiring board or a wiring disconnection may be caused. In view of this, for example, JP-A-2007-194341 describes a technique in which a textured structure is formed on the outermost layer of a flexible printed wiring board to improve abrasion resistance, thereby preventing scraping of particles and wiring disconnection.

Due to its high flexibility, a portion of the flexible printed wiring board, where a component such as a connector is to be mounted, needs to be reinforced in order to ensure strength required for the mounting. Generally, such a partial reinforcement is implemented by using an adhesive to firmly bond an inflexible reinforcing sheet onto a back side of the mounting area of the flexible printed wiring board.

However, the flexible printed wiring board is made of highly hygroscopic material. Therefore, during a heating treatment for hardening the adhesive, which is applied on the connector mounting area of the flexible printed wiring board to bond the reinforcing sheet thereon, water vapor is generated between the adhesive and the flexible printed wiring board. The water vapor may cause a reduction in adhesion strength between the flexible printed wiring board and the adhesive, which would result in insufficient reinforcement. Insufficient adhesion between the reinforcing sheet and the flexible printed wiring board may cause a connection error between the flexible printed wiring board and a component to be mounted thereon.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, a flexible printed wiring board includes a component mounting portion to which a component is mounted and to which a reinforcing sheet is bonded. The component mounting portion includes an inner layer comprising a wiring pattern, and an outermost film layer disposed to cover the wiring pattern. The outermost film layer, to which the reinforcing sheet is bonded, is formed with a groove such that, when the reinforcing sheet is bonded, the groove extends in a region between the outermost film layer and the reinforcing sheet and communicates with an outside of the region.

Figure 1:
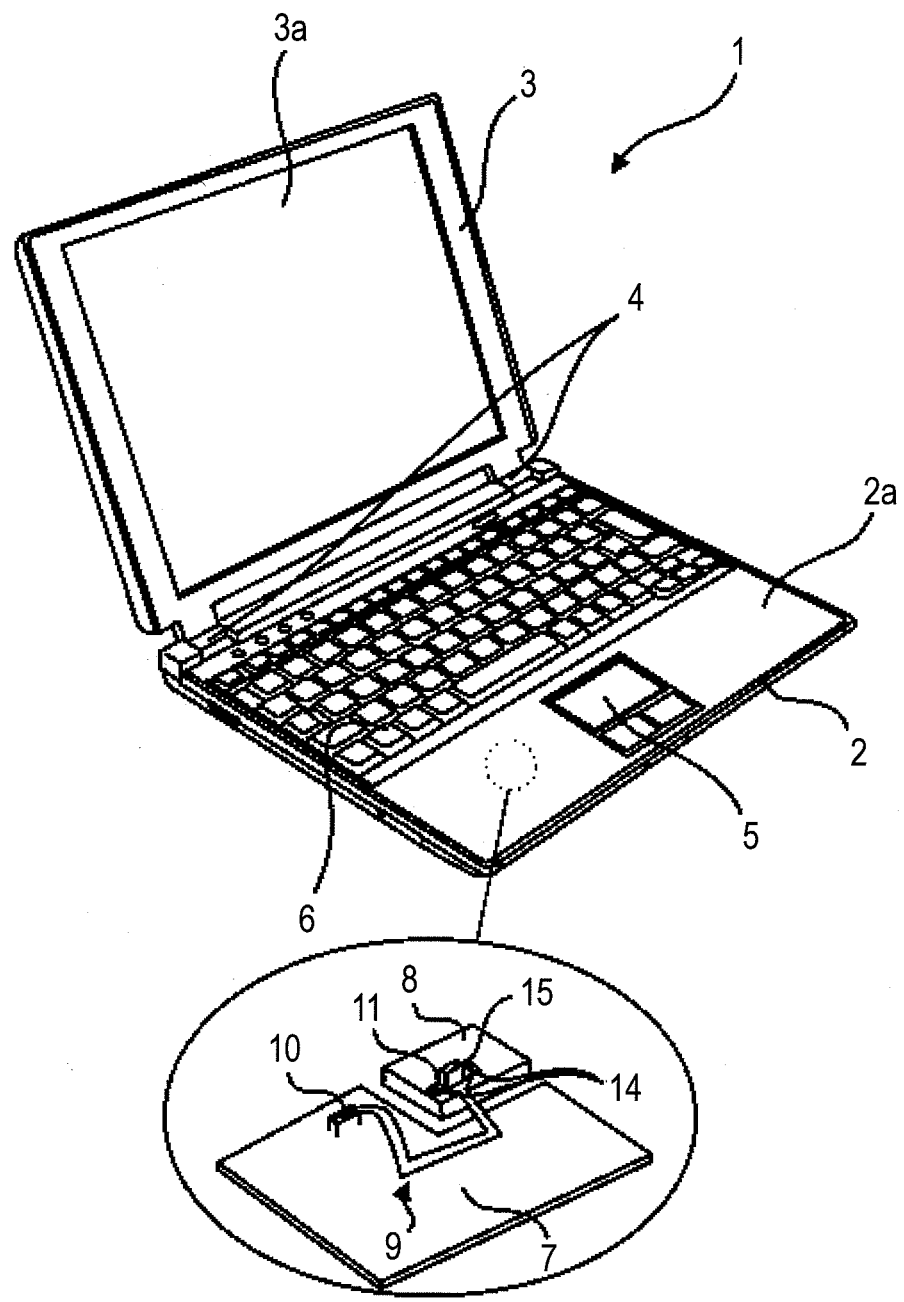
FIG. 1 is an exemplary external view of a personal computer according to an embodiment of the invention.

FIG. 1 is an exemplary external view of a personal computer 1, which is an electronic apparatus according to an embodiment the invention.

The personal computer 1 includes a base unit 2, a display unit 3, and a hinge portions 4 arranged between the base unit 2 and the display unit 3. The hinge portions 4 support the display unit 3 such that the display unit 3 is rotatable with respect to the base unit 2. The display unit 3 has a liquid crystal display 3a at the center thereof.

The base unit 2 includes a housing 2a, a touch pad 5, and a keyboard 6. The touch pad 5 and the keyboard 6 are arranged on an upper surface of the housing 2a. Inside the housing 2a, a printed circuit board 7 having circuit components mounted thereon and various devices 8 are provided. The circuit components on the printed circuit board 7 include, for example, large scale integration (LSI) chips such as a central processing unit (CPU), a graphic chip, and various random access memories (RAMs). The devices 8 include, for example, a hard disk drive (HDD) and an optical disc drive (ODD).

As shown in the enlarged view in FIG. 1, the printed circuit board 7 and the device 8 are coupled together via a flexible printed wiring board 9. The flexible printed wiring board 9 is used, for example, when the device 8 is arranged apart from the printed circuit board 7, or for connection in a hinge portion where a wiring or a substrate is required to be bent due to spatial restrictions.

Figure 2:
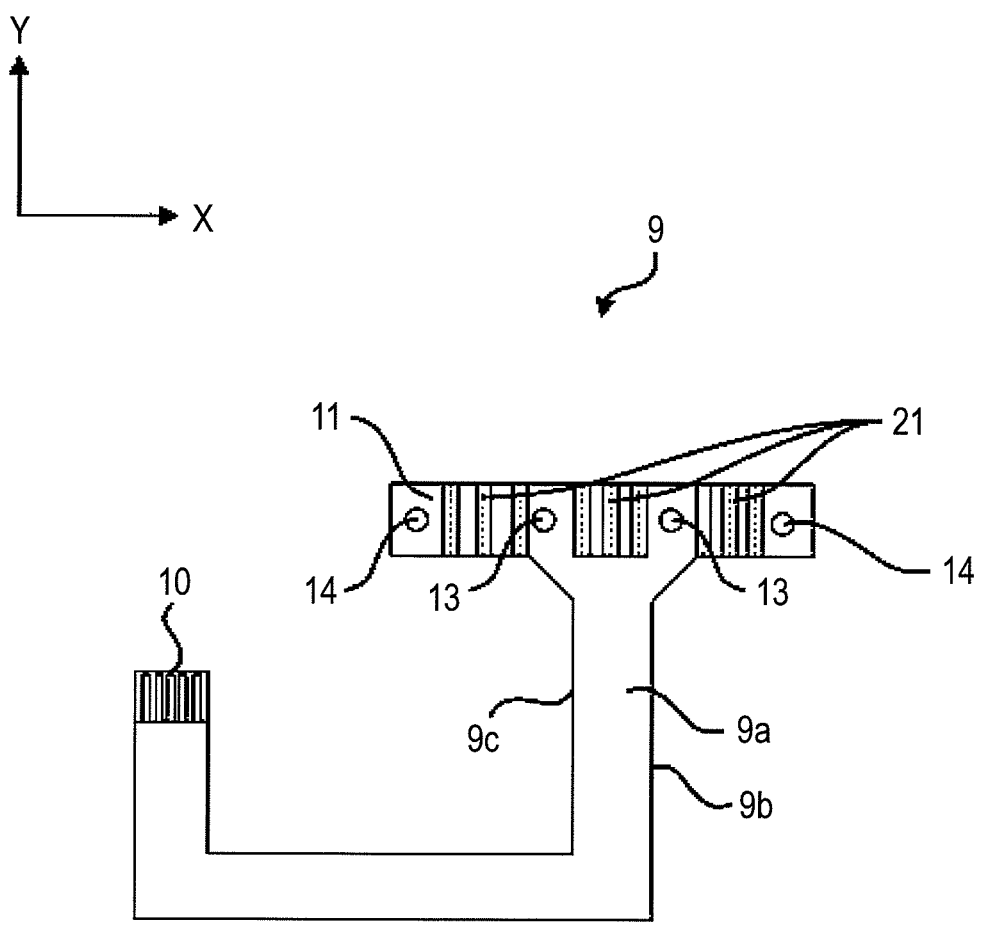
FIG. 2 is an exemplary top view of a flexible printed wiring board according to a first embodiment of the invention.

Next, a configuration of the flexible printed wiring board 9 according to a first embodiment of the invention will be described with reference to FIG. 2. FIG. 2 is an exemplary top view of the flexible printed wiring board 9 according to the first embodiment.

The flexible printed wiring board 9 includes an electrode terminal portion 10 and a connector mounting portion 11 (an example of a component mounting portion).

The electrode terminal portion 10 includes electrode terminals where a wiring pattern is exposed, so that it is attachable and detachable with respect to a connector provided on the printed circuit board 7 or the device 8. A connector 15 (an example of a component) is mounted on the connector mounting portion 11. Fixing holes 14 are formed through the connector mounting portion 11 in a thickness direction of the connector mounting portion 11. The connector mounting portion 11 may be fixed to the printed circuit board 7 or to the device 8 by, for example, fastening screws into the fixing holes 14.

The flexible printed wiring board 9 includes a first surface 9a and a second surface 9b which is the back side opposite the first surface 9a. The peripheral edge of the first surface 9a will hereinafter be referred to as a perimeter 9c.

As shown in the enlarged view in FIG. 1, the electrode terminal portion 10 is attached to the connector on the printed circuit board 7, and the connector mounting portion 11 is fixed to the device 8 by fastening the screws into the fixing holes 14. Portions of the flexible printed wiring board 9 other than the electrode terminal portion 10 and the connector mounting portion 11 are covered with a resin layer of a vinyl-based material, an acryl-based material, or a urethane-based material.

The first surface 9a of the connector mounting portion 11A is formed with a plurality of grooves 21.

The grooves 21 are formed by, for example, sandblasting, embossing, or plasma processing. Two solid lines of each of the grooves 21 in FIG. 2 indicate upper ends of the groove 21. A dotted line disposed between the two solid lines indicates a bottom of the groove 21 (a concave portion) formed by the above-mentioned process. The grooves 21 extend to reach the perimeter 9c of the connector mounting portion 11.

Figure 3:
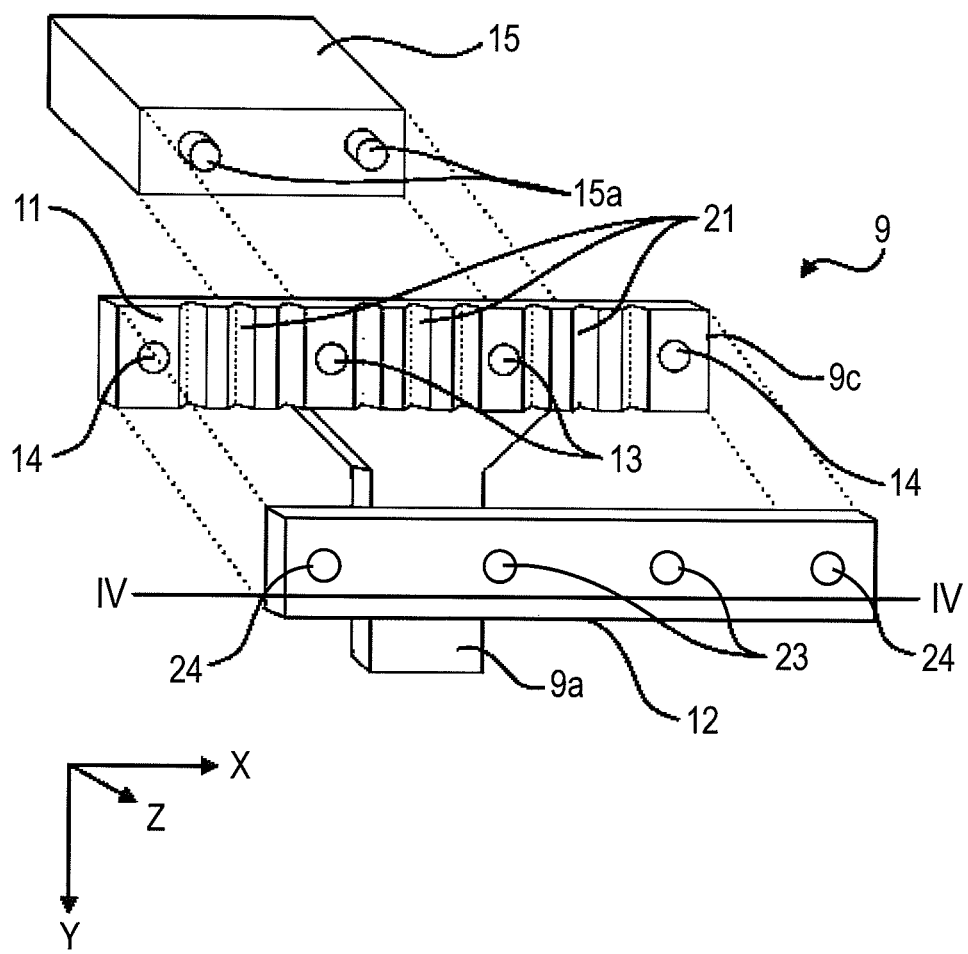
FIG. 3 is an exemplary perspective view of a mounting structure of the flexible printed wiring board according to the first embodiment.

Next, a mounting structure of a reinforcing sheet 12 and a connector 15 to the connector mounting portion 11 of the flexible printed wiring board 9 will be described with reference to FIG. 3. FIG. 3 is an exemplary perspective view of the mounting structure of the flexible printed wiring board 9 according to the first embodiment. In the following description, X, Y, and Z axes are defined as shown in FIG. 3 in connection with the configuration of the flexible printed wiring board 9. That is, the grooves 21 are formed along the Y axis. The respective layers of the flexible printed wiring board 9, which will be described later, are laminated in the Z-axis direction.

First, one surface of the connector mounting portion 11 having the grooves 21 and the reinforcing sheet 12 are bonded together via an adhesive 20. By providing the grooves 21, an adhesion area of the adhesive 20 is increased, thereby improving adhesion strength. The reinforcing sheet 12 is formed connector positioning holes 23 and fixing holes 24 provided at positions corresponding to connector positioning holes 13 and the fixing holes 14 of the connector mounting portion 11, respectively. Protruding portions 15a of the connector 15 are fitted into the respective connector positioning holes 13 of the connector mounting portion 11 from the side opposite to the reinforcing sheet 12, whereby the connector 15 is mounted on the connector mounting portion 11.

Figure 4:
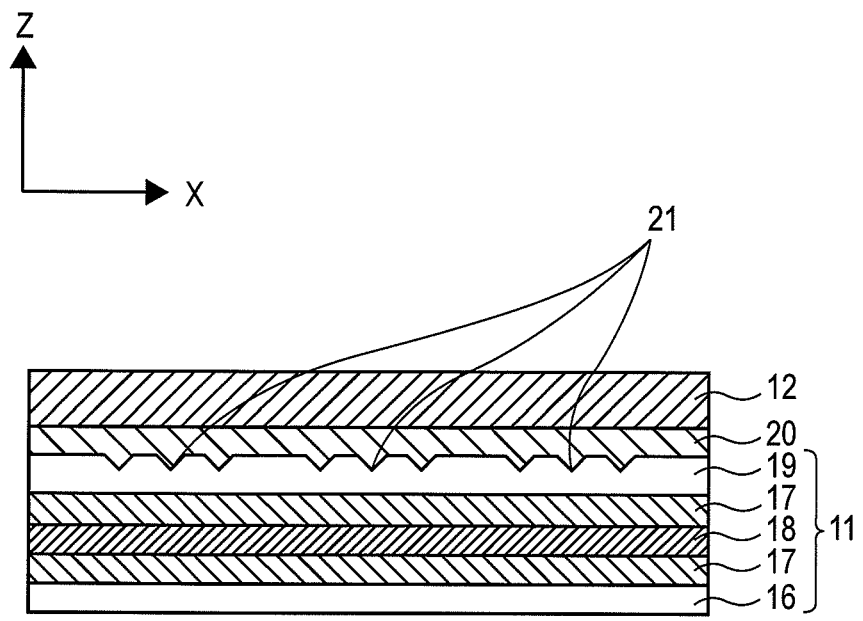
FIG. 4 is an exemplary sectional view of the flexible printed wiring board according to the first embodiment on which a reinforcing sheet is mounted.

Next, a cross-sectional structure taken along the line IV-IV of FIG. 3 with the reinforcing sheet 12 mounted to the flexible printed wiring board 9 will be described with reference to FIG. 4. FIG. 4 is an exemplary sectional view of the flexible printed wiring board 9 according to the first embodiment on which the reinforcing sheet 12 is mounted.

First, the connector mounting portion 11 is formed by laminating a base film layer 16, an adhesive layer 17, a conductor layer 18, and a cover film layer 19. The base film layer 16 and the cover film layer 19 are plastic films made of, for example, polyimide, polyparaphenylene terephthalamide, polyethernitrile, polyethersulfone, polyethylene terephthalate, polyethylene naphthalate, or polyvinyl chloride. In this embodiment, polyimide films are used as the base film layer 16 and the cover film layer 19. The polyimide films are advantageous in terms of heat resistance, dimensional stability, electrical characteristics, mechanical characteristics, chemical resistance, and costs.

According to this embodiment, the plurality of grooves 21 is provided in the cover film layer 19.

The grooves 21 are formed so as to reach the perimeter 9c of the connector mounting portion 11 and to communicate with the outside at the perimeter 9c of the connector mounting portion 11. In this embodiment, each of the grooves 21 has a V-shaped section. However, the sectional shape of the groove 21 is not limited to a V-shape, and may be a U-shape or a rectangular shape.

Between the base film layer 16 and the cover film layer 19, the conductor layer 18 is disposed with the adhesive layers 17 interposed therebetween. The adhesive layer 17 is made of, for example, a material containing an epoxide compound. The conductor layer 18 is made of a metal foil, such as a copper foil or an aluminum foil, and a wiring pattern is formed in the conductor layer 18 by etching.

Onto the connector mounting portion 11 having the grooves 21 as described above, the reinforcing sheet 12 is bonded via the adhesive 20. The reinforcing sheet 12 is made of, for example, a glass epoxy material or an epoxy material. The reinforcing sheet 12 has the connector positioning holes 23 and the fixing holes 24 at positions corresponding to the connector positioning holes 13 and the fixing holes 14 of the connector mounting portion 11. The reinforcing sheet 12 is joined to the connector mounting portion 11 via the adhesive 20. By firmly bonding the reinforcing sheet 12, the strength of the connector mounting portion 11 is improved so that the connector 15 can stably be mounted.

Figure 5:
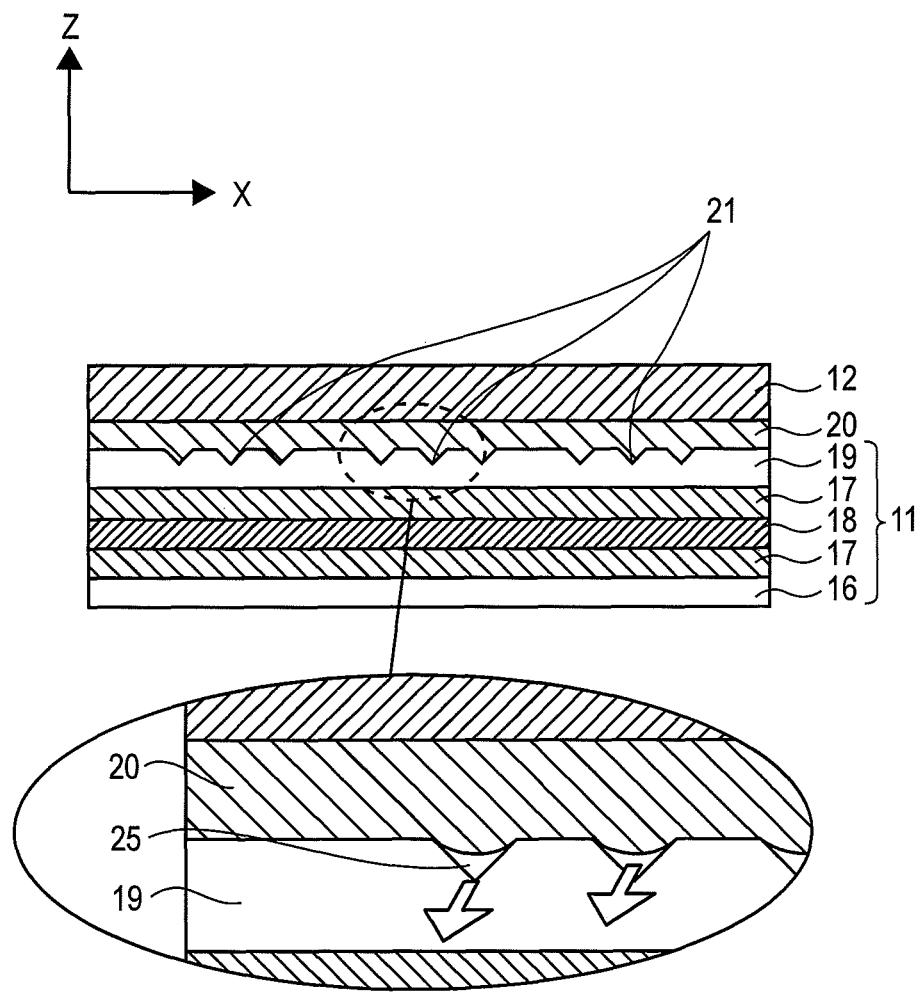
FIG. 5 is an exemplary enlarged view illustrating grooves of the flexible printed wiring board according to the first embodiment.

Next, a structure of the adhesive 20 in the grooves 21 will be described with reference to FIG. 5. FIG. 5 is an exemplary enlarged view of the grooves 21 of the flexible printed wiring board 9 according to the first embodiment. The adhesive 20 has a viscosity that is higher than that of a liquid. Therefore, the adhesive 20 does not reach the bottom of the groove 21 and, thus, bubble outlets 25 are formed. Because the grooves 21 are formed so as to extend to reach the perimeter 9c of the connector mounting portion 11, the bubble outlet 25 communicates with the outside.

The material of the flexible printed wiring board 9, polyimide, has high hygroscopicity.

Therefore, during a heating treatment for bonding the reinforcing sheet 12, water vapor is generated between the adhesive 20 and the cover film layer 19 due to evaporation of water molecules that have been absorbed to the reinforcing sheet 12. However, because the bubble outlets 25 are provided, the water vapor is discharged from the bubble outlets 25 to the outside in the Y-axis direction as illustrated by arrows in the enlarged view in FIG. 5. Accordingly, air bubbles are prevented from being generated between the adhesive 20 and the cover film layer 19. As a result, the adhesion strength between the adhesive 20 and the connector mounting portion 11 is improved, and an exfoliation of the reinforcing sheet 12 is prevented.

According to the first embodiment having the configuration described above, the grooves 21 are provided in the cover film layer 19. Therefore, it is possible to increase the adhesion area of the adhesive that joins the flexible printed wiring board 9 and the reinforcing sheet 12 and thus the adhesion strength is improved. Further, since the grooves 21 are provided so as to extend to reach the perimeter 9c of the flexible printed wiring board 9, it is possible to discharge the water vapor generated between the cover film layer 19 and the adhesive 20 to the outside. Therefore, it is possible to prevent the occurrence of air bubbles and exfoliation between the connector mounting portion 11 and the reinforcing sheet 12, thereby improving the adhesion strength of the reinforcing sheet 12.

Figure 6A:
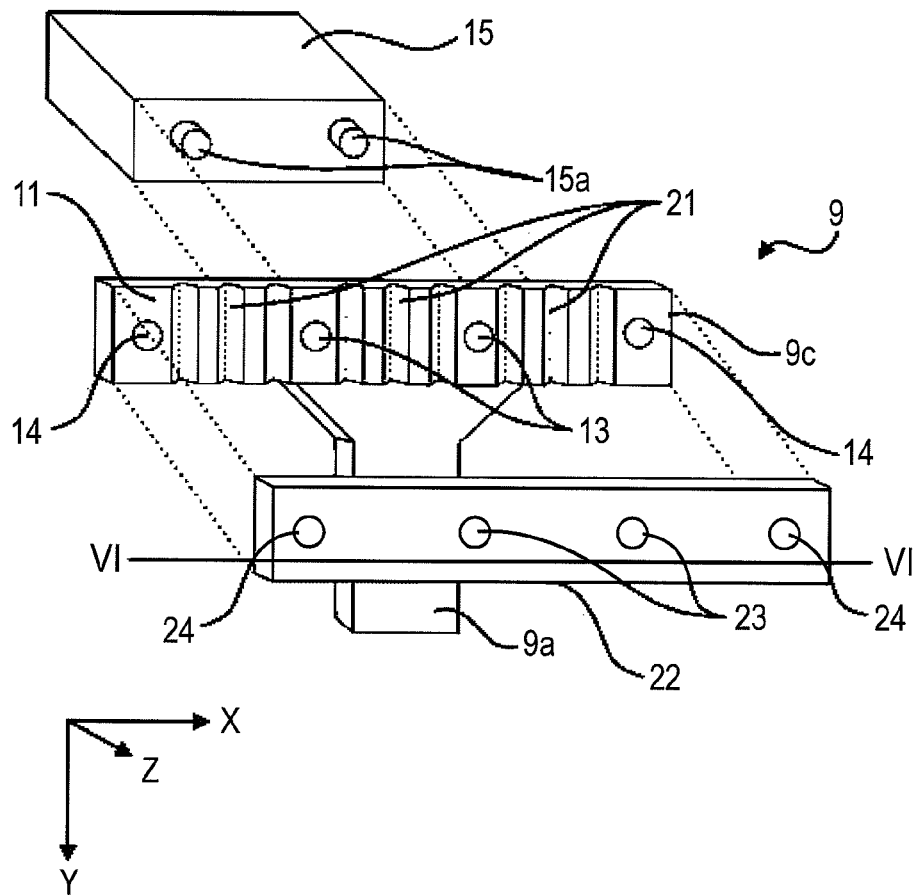
FIG. 6A is an exemplary perspective view of a flexible printed wiring board according to a second embodiment of the invention.
Figure 6B:
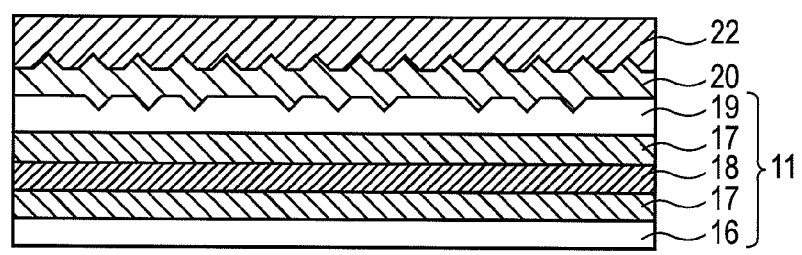
FIG. 6B is an exemplary sectional view of the flexible printed wiring board according to the second embodiment.

Next, a configuration of a flexible printed wiring board 9 according to a second embodiment of the invention will be described with reference to FIGS. 6A and 6B. FIG. 6A is an exemplary perspective view of the flexible printed wiring board 9 according to the second embodiment, and FIG. 6B is an exemplary sectional view taken along the line VI-VI of FIG. 6A.

The second embodiment is different from the first embodiment in that, as shown in FIG. 6A, the reinforcing sheet mounted on the connector mounting portion 11 of the flexible printed wiring board 9 is a grooved reinforcing sheet 22. That is, as shown in FIG. 6B, one surface of the reinforcing sheet 22 that comes into contact with the adhesive 20 is formed with grooves. The grooves 21 of the reinforcing sheet 22 are formed by, for example, sandblasting, embossing, or plasma processing, similarly to the grooves 21 of the cover film layer 19. Further, the grooves of the reinforcing sheet 22 also extend to reach a perimeter of the reinforcing sheet 22. Therefore, water vapor generated between the grooved reinforcing sheet 22 and the adhesive 20 is discharged to the outside from bubble outlets, which are similar to the bubble outlets 25 of FIG. 5.

According to the second embodiment having the configuration described above, the grooved reinforcing sheet 22 is used. Therefore, it possible to further increase the adhesion area of the adhesive 20 between the flexible printed wiring board 9 and the reinforcing sheet so that the adhesion strength is further improved. In addition, the water vapor generated between the grooved reinforcing sheet 22 and the adhesive 20 is discharged to the outside in the Y-axis direction in a similar manner as in the region between the cover film layer 19 and the adhesive 20.

Figure 7:
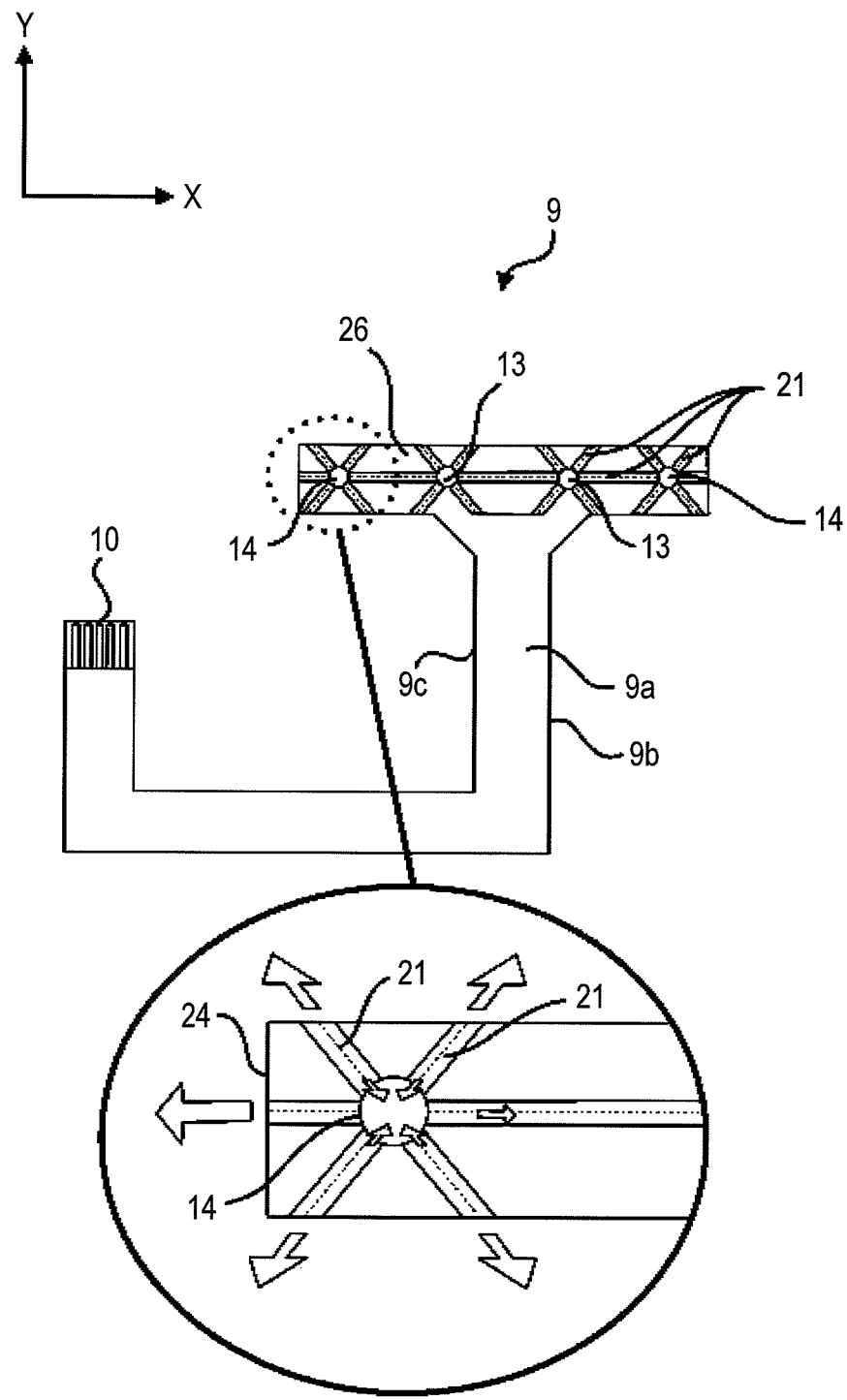
FIG. 7 is an exemplary top view of a flexible printed wiring board according to a third embodiment of the invention.

Next, a configuration of a flexible printed wiring board 9 according to a third embodiment of the invention will be described with reference to FIG. 7. FIG. 7 is an exemplary top view of the flexible printed wiring board 9 according to the third embodiment.

The third embodiment is different from the second embodiment in the arrangement of the grooves 21 of the flexible printed wiring board 9. More specifically, the grooves on a connector mounting portion 26 of the flexible printed wiring board 9 are radially formed from the respective centers of the connector positioning holes 13 and the center of the fixing holes 14. That is, the grooves 21 communicate with the connector positioning hole 13, the fixing hole 14, and the perimeter 9c of the connector mounting portion 26.

By forming the grooves 21, it possible to increase the adhesion area of the adhesive 20 to improve the adhesion strength between the flexible printed wiring board 9 and the reinforcing sheet 12. In addition, it is possible to discharge water vapor generated between the cover film layer 19 and the adhesive 20 from the bubble outlets 25 formed between the cover film layer 19 and the adhesive 20. According to the third embodiment, moreover, it is possible to discharge the water vapor to the outside from the connector positioning holes 13 the fixing hole 14 as illustrated by arrows in the enlarged view in FIG. 7, in addition to the discharge from the perimeter 9c of the connector mounting portion 26.

According to the third embodiment having the configuration described above, the grooves 21 are radially provided from the respective centers of the connector positioning holes 13 and the fixing holes 14. Therefore, it possible to increase the adhesion area of the adhesive interposed between the flexible printed wiring board 9 and the reinforcing sheet so that the adhesion strength is further improved. In addition, since the grooves 21 are formed so as to communicate with the connector positioning holes 13, the fixing holes 14, and the perimeter 9c of the connector mounting portion 26, it is possible to discharge the water vapor generated between the cover film layer 19 and the adhesive 20 from respective ends of each of the grooves 21 to the outside.

While the grooves 21 are formed to reach the perimeter 9c in the embodiments described above, the grooves 21 may not necessarily reach the perimeter 9c. That is, the water vapor generated between the cover film layer 19 and the adhesive 20 can be discharged by forming the grooves 21 such that, when the reinforcing sheet is bonded, the grooves 21 extends in a region between the cover film layer 19 and the reinforcing sheet and communicates with an outside of the region between the cover film layer 19 and the reinforcing sheet. For example, in a case in which the reinforcing sheet 12 is smaller than the connector mounting portion, the grooves 21 are exposed to the outside of the region between the cover film layer 19 and the reinforcing sheet.

Further, while one-side flexible printed wiring board is described as an example of the flexible printed wiring board in the embodiments described above, the flexible printed wiring board according to another embodiment of the invention may be a double-side flexible printed wiring board. In this case, by providing the grooves 21 on one of the outermost cover film layers of the double-side flexible printed wiring board, it is possible to improve the adhesion strength of the reinforcing sheet 12 in a similar manner as in the embodiments described above.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all the components disclosed in the embodiments. Further, components in different embodiments may be appropriately combined.

What is claimed is:

1. An electronic apparatus comprising: a housing; a flexible printed wiring board housed in the housing; a reinforcing sheet bonded to the flexible printed wiring board, wherein a groove is formed in a bonding surface of the reinforcing sheet, which is bonded to the flexible printed wiring board, such that at least one end of the groove is extended to an outside of the reinforcing sheet, wherein a plurality of holes are formed through the reinforcing sheet in a thickness direction thereof, and both ends of the groove are extended to at least two holes of the plurality of holes; wherein the flexible printed wiring board includes a connector mounting portion having a first connector positioning hole and a first fixing hole, and the reinforcing sheet has: a second connector positioning hole corresponding to the first connector positioning hole; and a second fixing hole corresponding to the first fixing hole, and wherein the reinforcing sheet is bonded to the flexible printed wiring board via an adhesive.

2. The electronic apparatus of claim 1, wherein the holes serve as positioning of a connector.

3. The electronic apparatus of claim 1, wherein the flexible printed wiring board is made of polyimide, and the reinforcing sheet is made of a glass epoxy, and
  wherein the flexible printed wiring board includes an electrode terminal portion and a connector mounting portion,
  the flexible printed wiring board other than the electrode terminal portion and the connector mounting portion is covered with a resin layer of a vinyl-based material, an acryl-based material, or a urethane-based material.

4. The electronic apparatus of claim 1, wherein the groove is formed by sandblasting, embossing, or plasma processing.

5. The electronic apparatus of claim 1, further comprising:
  a printed circuit board having a circuit component, wherein the circuit component is an LSI chip selected from a CPU, a graphic chip and a RAM; and
  a device selected from one of a hard disk drive and an optical disc drive, wherein the printed circuit board and the device are housed in the housing.

* * * * *